United States Patent
Somma et al.

(10) Patent No.: US 11,990,442 B2
(45) Date of Patent: May 21, 2024

(54) SEMICONDUCTOR DEVICE AND CORRESPONDING METHOD

(71) Applicant: STMicroelectronics S.r.l., Agrate Brianza (IT)

(72) Inventors: Cristina Somma, Milan (IT); Aurora Sanna, Milan (IT); Damian Halicki, Agrate Brianza (IT)

(73) Assignee: STMicroelectron S.r.l., Agrate Brianza (IT)

( * ) Notice: Subject to any disclaimer, the term of this patent is extended or adjusted under 35 U.S.C. 154(b) by 198 days.

(21) Appl. No.: 17/537,112

(22) Filed: Nov. 29, 2021

(65) Prior Publication Data

US 2022/0173064 A1    Jun. 2, 2022

(30) Foreign Application Priority Data

Dec. 1, 2020    (IT) .................. 102020000029210

(51) Int. Cl.
*H01L 23/00* (2006.01)
*H01L 23/498* (2006.01)

(52) U.S. Cl.
CPC ........ *H01L 24/16* (2013.01); *H01L 23/49838* (2013.01); *H01L 24/17* (2013.01);
(Continued)

(58) Field of Classification Search
CPC ... H01L 24/16; H01L 23/49838; H01L 24/17; H01L 2224/1713; H01L 2924/30101;
(Continued)

(56) References Cited

U.S. PATENT DOCUMENTS 5,841,074 A    11/1998    Egan et al.
5,903,050 A    5/1999    Thurairajaratnam et al.
(Continued)

FOREIGN PATENT DOCUMENTS

JP    2009283779 A    12/2009
JP    2017188579 A  * 10/2017

OTHER PUBLICATIONS

EP Search Report and Written Opinion for family-related EP Appl. No. 21210940, report dated Apr. 12, 2022, 8 pgs.
(Continued)

*Primary Examiner* — Nduka E Ojeh
*Assistant Examiner* — Laura M Dykes
(74) *Attorney, Agent, or Firm* — Crowe & Dunlevy LLC

(57) ABSTRACT

A semiconductor die is mounted at a die area of a ball grid array package that includes an array of electrically-conductive ball. A power channel conveys a power supply current to the semiconductor die. The power channel is formed by an electrically-conductive connection plane layers extending in a longitudinal direction between a distal end at a periphery of the package and a proximal end at the die area. A distribution of said electrically-conductive balls is made along the longitudinal direction. The electrically-conductive connection plane layer includes subsequent portions in the longitudinal direction between adjacent electrically-conductive balls of the distribution. Respective electrical resistance values of the subsequent portions monotonously decrease from the distal end to the proximal end. A uniform distribution of power supply current over the length of the power channel is thus facilitated.

21 Claims, 7 Drawing Sheets

(52) U.S. Cl.
CPC .............. *H01L 2224/16225* (2013.01); *H01L 2224/1713* (2013.01); *H01L 2924/30101* (2013.01)

(58) Field of Classification Search
CPC ............. H01L 23/5283; H01L 23/5286; H01L 2224/1412; H01L 2224/1712; H05K 7/1061; H05K 1/0265
USPC ........................................................ 257/738
See application file for complete search history.

(56) References Cited

U.S. PATENT DOCUMENTS

| | | | |
|---|---|---|---|
| 6,496,383 | B1 | 12/2002 | Herrell et al. |
| 8,536,716 | B1 | 9/2013 | Abdulla et al. |
| 2007/0295818 | A1 | 12/2007 | Li et al. |
| 2010/0032195 | A1* | 2/2010 | Hayashi .................. H01L 23/50 174/262 |
| 2014/0346678 | A1 | 11/2014 | DeLaCruz |
| 2015/0313006 | A1 | 10/2015 | Lane et al. |
| 2015/0364438 | A1 | 12/2015 | Xu et al. |
| 2018/0184514 | A1* | 6/2018 | Yamada .................. H05K 1/116 |
| 2019/0230792 | A1* | 7/2019 | Nakamoto ........ H01L 23/49822 |

OTHER PUBLICATIONS

IT Search Report and Written Opinion for priority application IT Appl. No. 102020000029210 dated Aug. 24, 2021 (8 pages).

* cited by examiner

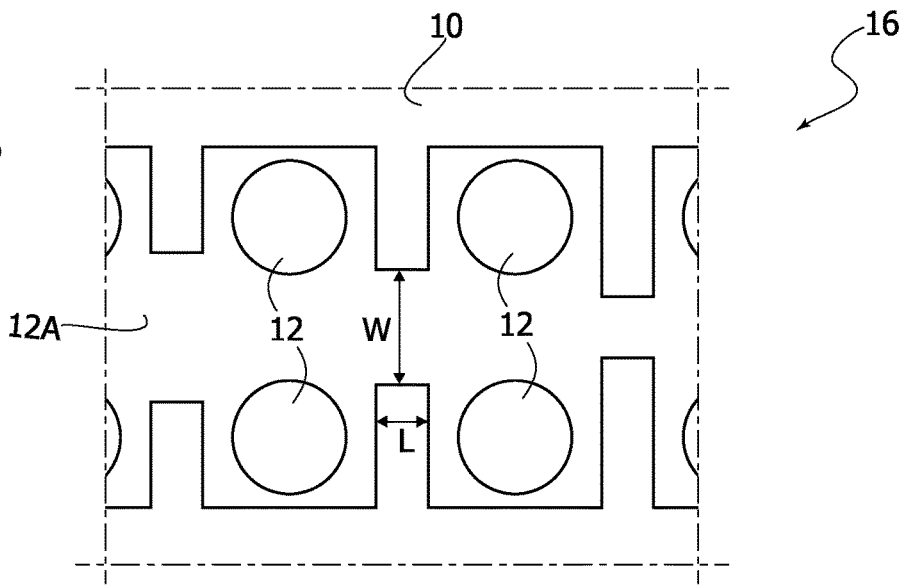
FIG. 6
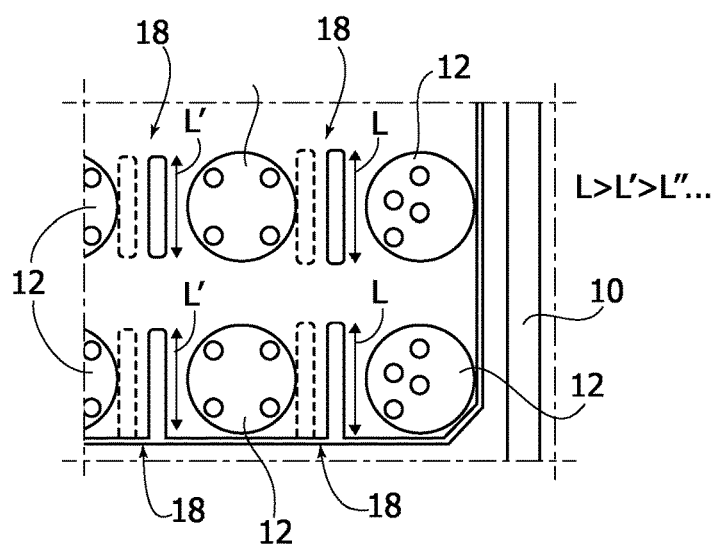
FIG. 7
FIG. 8
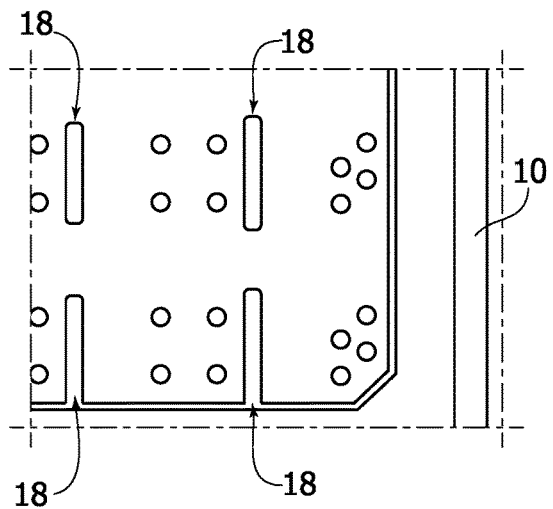
FIG. 9
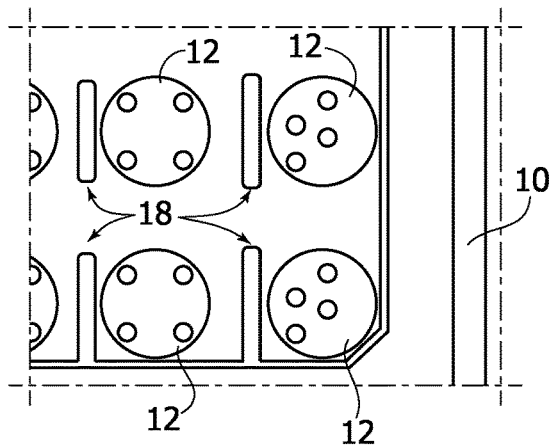

SEMICONDUCTOR DEVICE AND CORRESPONDING METHOD

PRIORITY CLAIM

This application claims the priority benefit of Italian Application for Patent No. 102020000029210, filed on Dec. 1, 2020, the content of which is hereby incorporated by reference in its entirety to the maximum extent allowable by law.

TECHNICAL FIELD

The description relates to semiconductor devices.

One or more embodiments can be applied to semiconductor devices comprising Ball Grid Array (BGA) packages.

One or more embodiments can be applied to high-power BGA package designs in wire-bond and flip-chip configurations.

BACKGROUND

Increasingly strict current management specifications apply to high-end digital products, which may result in various issues at the package and printed circuit board (PCB) level.

A so-called power-channel structure may be resorted to in order to facilitate distributing power (current) from the outer periphery to the inner power balls located at the center of the ball grid array (BGA) substrate, just below the semiconductor chip or die.

It is noted that, at the package level, certain balls in the array can be traversed by an excessive current, which may give rise to electro-migration issues. That is, the current tends to flow through the outermost balls that are closer to the voltage regulator causing a critical bottleneck. Uniform connection plane layer reduces the maximum acceptable current because of the non-uniform current distribution at the ball level.

There is a need in the art to contribute in overcoming the drawbacks outlined in the foregoing.

SUMMARY

One or more embodiments may relate to a semiconductor device.

One or more embodiments may relate to a corresponding method.

One or more embodiments may provide an improved solution at a package level which facilitates obtaining a uniform current distribution.

One or more embodiments provide a power channel connection plane layer which leads to a more uniform current distribution over ball grid array (BGA) power channel balls.

One or more embodiments may involve a controlled variation of the resistance seen from different ball columns to the die.

In one or more embodiments, current flow may be modulated forming specific incremental apertures (voids) on the power channel connection plane.

In one or more embodiments, this may involve creating voids in the plane layer with a progressive size reduction from the edge to the center of the package. The position of the voids with respect to each ball column can be devised to make the structure replicable for plural ball rows (more than two).

In one or more embodiments such a structure can be replicated on each power connection plane layer by complying with conventional substrate design rules (for instance, avoiding overlapping voids in vertically adjacent layers).

One or more embodiments may thus be adapted in compliance with an optimal number of ball rows comprised in the package power channel (which may depend on factors such as the current consumption of the die, the package power balls budget and substrate stack-up).

In one or more embodiments, local current density can be reduced.

In one or more embodiments, a more uniform current distribution among balls facilitates reducing the number of balls involved in providing a certain amount of power supply. This in turn facilitates reducing package size as well as substrate stack-up, which is beneficial in terms overall package cost.

One or more embodiments can be implemented at a device level, for instance as a BGA package comprising a power channel connection plane to connect rows of power channel balls, providing a resistive path of decreasing values between adjacent rows of power channel balls, from periphery to center, with varying cross-sections along the current propagation path.

One or more embodiments may provide one or more of the following advantages: uniform current distribution on BGA power-channel balls; embodiments can be applied to single and multi-layer connection plane layer configurations as well as to any standard substrate stack-up and materials; no additional manufacturing and assembly processes involved; and various different implementations available.

BRIEF DESCRIPTION OF THE DRAWINGS

One or more embodiments will now be described, by way of example only, with reference to the annexed figures, wherein:

FIG. 6 is detailed view of a portion of a possible implementation of a power channel as exemplified in FIG. 4;

FIGS. 7 to 9 are plan views illustrative of a power channel according to the present description;

DETAILED DESCRIPTION

In the ensuing description, one or more specific details are illustrated, aimed at providing an in-depth understanding of examples of embodiments of this description. The embodiments may be obtained without one or more of the specific details, or with other methods, components, materials, etc. In other cases, known structures, materials, or operations are not illustrated or described in detail so that certain aspects of embodiments will not be obscured.

Reference to "an embodiment" or "one embodiment" in the framework of the present description is intended to indicate that a particular configuration, structure, or characteristic described in relation to the embodiment is comprised in at least one embodiment. Hence, phrases such as "in an embodiment" or "in one embodiment" that may be present in one or more points of the present description do not necessarily refer to one and the same embodiment.

Moreover, particular conformations, structures, or characteristics may be combined in any adequate way in one or more embodiments.

The headings/references used herein are provided merely for convenience and hence do not define the extent of protection or the scope of the embodiments.

Throughout the figures, like parts and elements are indicated with like references so that a detailed description will not be repeated for each and every figure for brevity.

Figure 1:
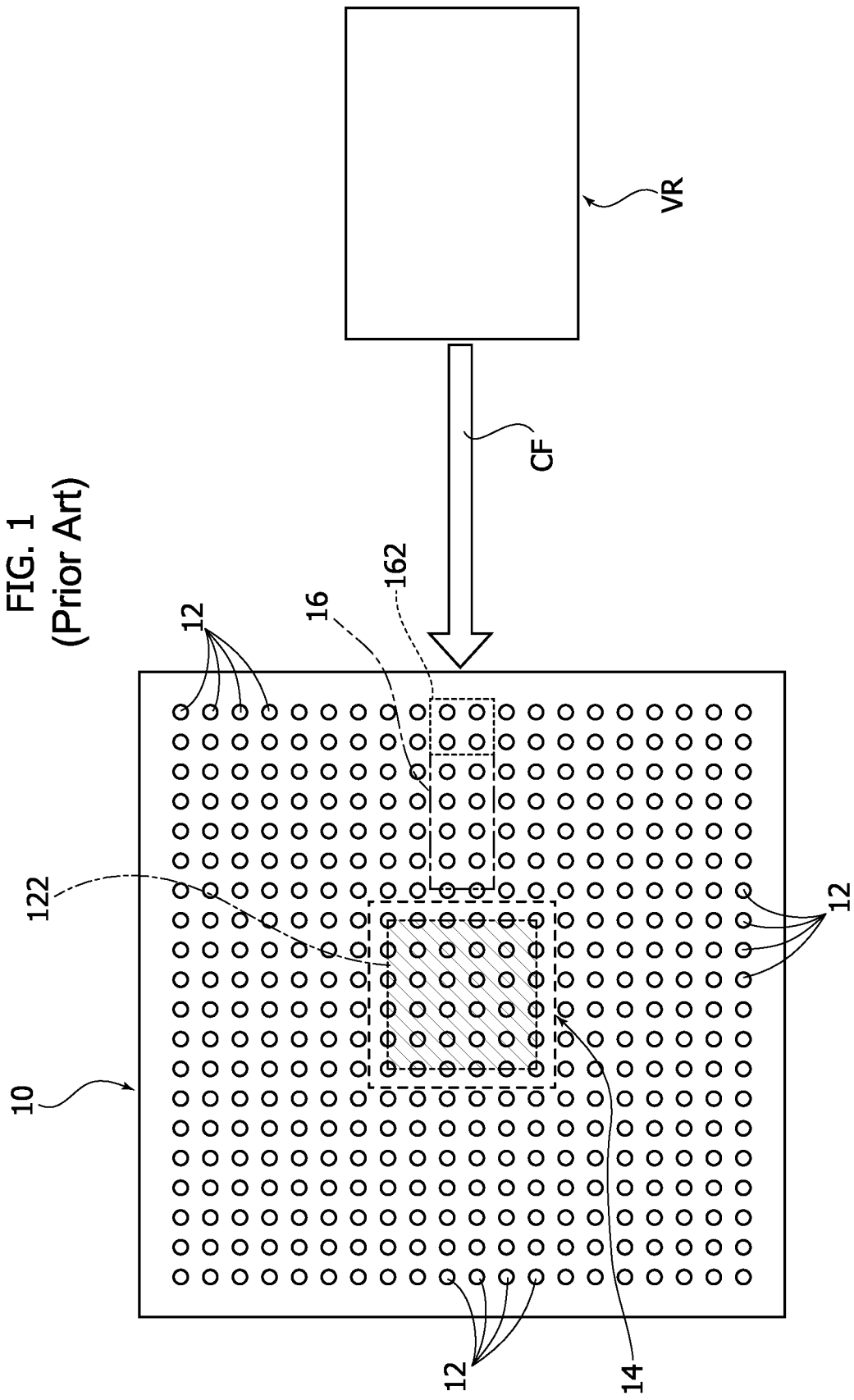
FIG. 1 is a plan view of a ball grid array (BGA) package exemplary of a possible context of use of embodiments according to the present description.

FIG. 1 is an exemplary plan view from the rear or bottom surface of a conventional Ball Grid Array (BGA) of a semiconductor device package 10 including an array of spherical contacts or "balls" 12. The balls provide electrical connections for a semiconductors chip or die 14 (whose outline is shown in dashed lines in FIG. 1) attached at a die area facing the top or front side of the package 10.

The ball array is intended to facilitate mounting the package 10 onto a substrate (such as a printed circuit board (PCB) S in FIGS. 3 and 5 discussed in the following). Power supply to the semiconductor chip or die in the package 10 can be provided via a voltage regulator VR (possibly hosted on the PCB) with a current flow CF from the periphery of the package 10 to a sub-set 122 of the BGA balls located at the center of the package, under the die area (that is, to the area where the die 14 is mounted).

Figure 2:
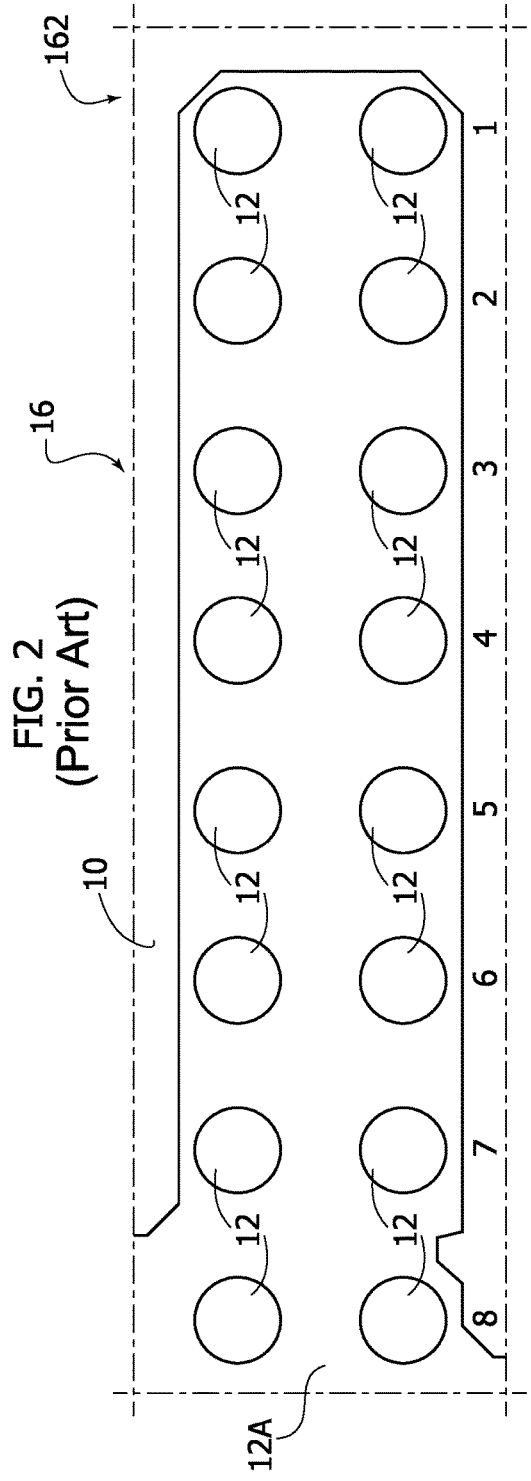
FIG. 2 is a plan view of a conventional power channel which may be included in a BGA package as exemplified in FIG. 1.

A so-called power-channel structure 16 may be resorted to in order to facilitate current flow from the periphery of the package 10 to the "power" balls 122. As illustrated in FIG. 2, the power-channel 16 includes a subset of balls 12 which are coupled to a common electrically-conductive structure or "connection plane layer" 12A on the package side and to an electrically-conductive formation on the substrate (PCB) side which is in turn to be coupled to the power supply source (voltage regulator) VR providing the supply current CF.

Such an arrangement is otherwise conventional in the art, which makes it unnecessary to provide a more detailed description herein.

It is noted that the current CF tends to flow (mostly) through the "outermost" balls in the power channel 16 which, as indicated by 162 in FIG. 1, are closer to the voltage regulator VR causing a critical bottleneck.

Figure 3:
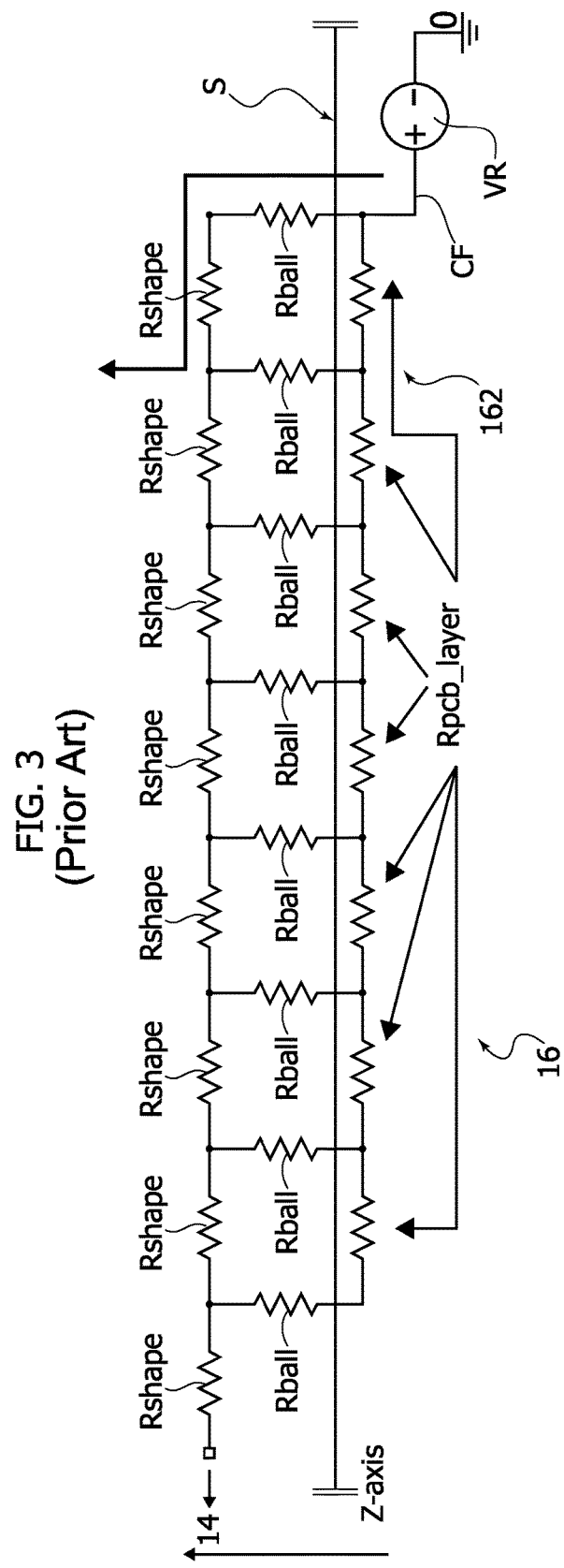
FIG. 3 is a circuit diagram explanatory of operation of a power channel as exemplified in FIG. 2.

The mechanism underlying this (undesired) phenomenon can be understood by referring to FIGS. 2 and 3.

FIG. 2 is essentially an enlarged view of a power channel 16 comprising, by way of example, two parallel rows or columns of 8 balls each (arranged in eight pairs numbered from 1 to 8) electrically coupled with a power channel connection plane 12A of uniform width.

FIG. 3 is a representation of a corresponding electrical circuit of such a power channel 16 used for coupling the die area (more to the point, the semiconductor chip or die 14 attached thereon) to the voltage regulator VR.

In FIG. 3: the resistances Rpcb_layer are exemplary of the resistances of electrically-conductive formation or tracks extending between adjacent pairs of balls 12 at the top or front surface of the substrate S (a PCB, for instance) onto which the package 10 is mounted via the RGB balls 12; the resistances Rball are exemplary of the resistances of the RGB balls 12 in the power channel 16, with these balls located between the top or front surface of the PCB and the bottom of back surface of the package 10 (Z-axis); and the resistances Rshape are exemplary of the resistances of the portions of the power channel connection plane 12A between adjacent pairs of balls 12 in the power channel 16.

Even without specific calculations, one can note that with all Rshape (and Rpcb_layer) values equal, the current CF will tend to follow the shortest path (having the lowest resistance value), which is essentially through the "outermost" balls 162, that is those balls 12 nearest to the voltage regulator VR (on the right-hand side of FIGS. 2 and 3).

One or more embodiments essentially rely on the concept of making that shortest path (or more generally, the shorter paths close to the voltage regulator VR) more resistive in order to re-distribute more uniformly the current CF over all the balls 182 of the power-channel 16.

As discussed in the following, this can be done without changes at the PCB level (that is, by keeping the values for Rpcb_layer constant).

Figure 4:
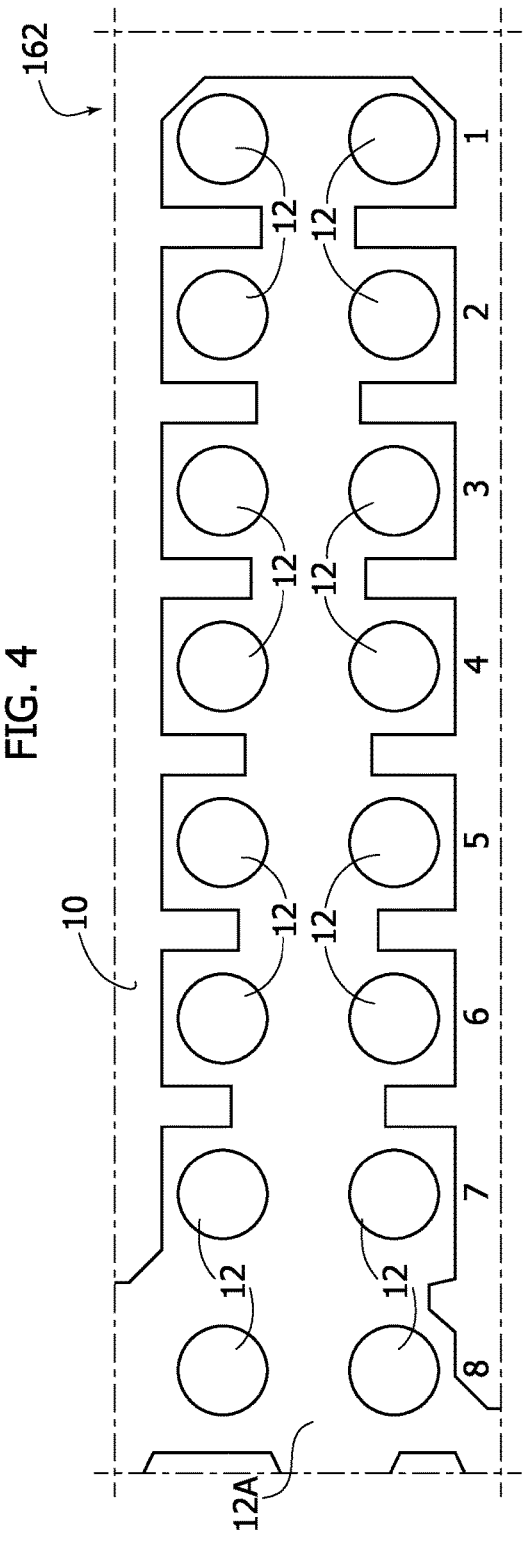
FIG. 4 is a plan view of a power channel according to embodiments herein which may be included in a BGA package as exemplified in FIG. 1.

FIG. 4 (and more to the point, the circuit diagram of FIG. 5, if compared with the circuit diagram of FIG. 3) show that the current CF can be more evenly (uniformly) distributed over the various paths through the balls 12 in the power channel 16 avoiding undesired congestion of the "peripheral" balls 12, indicated 162 by selecting Rshape_8<Rshape_7<Rshape_6<Rshape_5<Rshape_4< Rshape_3<Rshape_2<Rshape 1, where Rshape_j (with j=1 to 8 in the example illustrated) denotes the resistance value of the portion of the power channel connection plane 12A between two adjacent pairs of balls 12 in the power channel 16.

In that way, instead of flowing primarily, if not exclusively, through the balls 162 (the balls 12 in the power channel 16 nearest to the periphery of the packages), the current CF will be distributed more uniformly in such a way that the various pairs of balls 12 in the power channel 16, including the pairs nearest to the power balls 122 and the area of the die 14 will carry more evenly distributed fractions of the current CF (some exemplary percentage values will be discussed in the following).

By way of direct comparison with FIG. 2, FIG. 4 shows that such a result can be obtained, for instance by varying the width of the power channel connection plane 12A so that this width is narrowest at the "peripheral" balls 12 and becomes gradually larger towards the "inner" balls in the power channel 16, that is the balls nearest the power balls 122 and area of the die 14.

Stated otherwise, the power channel connection plane 12A as illustrated in FIG. 4 exhibits a flared shape going (right-to-left) from the periphery to the central portion of the package 10 and a tapered shape going (left-to-right) from the central portion to the periphery of the package 10.

Those skilled in the art will note that the resistance of a conductor is inversely proportional to its cross-sectional area and directly proportional to its length.

FIG. 6 illustrates two neighboring pairs of balls 12 in the power channel 16 and is exemplary of the possibility of obtaining Rshape_j<Rshape_j−1 by intervening both on the width W (and thus the cross-sectional area) and on the length L of the portion of the power channel connection plane 12A between the balls 12 of the j-th pair in the power channel 16, with j=1 to 8 in the example illustrated.

That is, a desired resistance value can be obtained ("modulated") by varying (narrowing or widening) the width W a portion of the channel 16 and varying the length L of the narrowed/widened portion.

It is otherwise noted that the representation provided in FIGS. 2 to 6 is a deliberately simplified one for the ease of explanation and understanding.

In fact, while these representations refer to a single conductive connection plane layer on the PCB and a single conductive connection plane layer on the package, one or more embodiments may contemplate plural multiple connection plane layers connected together in the Z direction, by means of vias for instance, as illustrated by the "dots" visible in figures such as FIGS. 7 through 17.

In that case, the various connection plane layers involved can be modified as discussed in the following in order to obtain the progressively varying resistance between balls as discussed in the following.

As discussed previously, the illustrative embodiments presented herein contemplate modifications in the package 10 (power channel connection plane 12A; resistance values Rshape_j). As discussed in the following, this can be done without changes at the level of the substrate S (a PCB, for instance), that is by keeping Rpcb_layer constant.

FIGS. 7, 8 and 9 are illustrative of how the concept (known per se) of providing voids on the power channel connection plane 12A of a power channel such as 16 can be applied to embodiments as exemplified herein.

Voids on such a connection plane layer can be created removing a portion of metal from a conductor layer in the power channel connection plane 12A as a standard substrate manufacturing process.

Such voids are beneficial in avoiding layer delamination issues. For instance, at least one void each 25 mm² facilitates substrate layer adhesion. Void overlapping on adjacent layers is generally avoided.

On a power channel 16 as exemplified herein, such voids, designated 18 in FIGS. 7, 8 and 9, can be provided with different shapes, be located at different positions and be in different numbers.

For instance, as illustrated in FIGS. 7, 8 and 9, the voids 18 can be of an oblong shape and be located also at the sides of the power channel connection plane 12A (that is forming notches or indentations at the sides of the power channel connection plane 12A).

As highlighted (only in FIG. 7, for simplicity) the lengths L, L', of the voids 18 can be varied to vary the width W of the channel 16 as desired (see FIG. 6).

The foregoing is otherwise compatible with the standard criteria for providing the voids 18.

For instance, for low-medium currents, a simple design and medium void width is compatible with open/full voids, that is voids completely surrounded by conductive material of the metal connection plane layer (a so-called, "full" voids: see the upper voids in FIGS. 7, 8 and 9) and with voids extending to the boundary of the connection plane layer (so-called "open" voids: see the lower voids in FIGS. 7, 8 and 9).

As regards positioning, voids as contemplated herein can be formed so that voids on adjacent layers have an offset.

Standard processes such as (copper) etching, fully-subtractive or semi-additive and full-additive methods, can be applied to producing voids (shaped as slots) 18 of controlled lengths L, L', . . . as desired.

In that respect FIG. 7 provides an exemplary plan view of a "complete" power channel 16 (bottom metal layer plus top layer) with the upper (inner) layer and the bottom metal layer illustrated separately in FIGS. 8 and 9.

As discussed previously, one or more embodiments can be applied also to multiple connection plane layers, possibly including more than two layers.

The case of two connection plane layers, presented in FIGS. 7, 8 and 9, is thus merely exemplary of such a multiple-layer structure with the purposes of exemplifying how voids can be shifted avoiding overlap when layers are adjacent.

FIG. 4 shows that embodiments where the power channel 16 comprise two rows of balls 12 can advantageously use (only) the "open void" option (see again the lower voids in FIGS. 7, 8 and 9) as this facilitates avoiding bottlenecks at the power plane boundaries.

Figure 10:
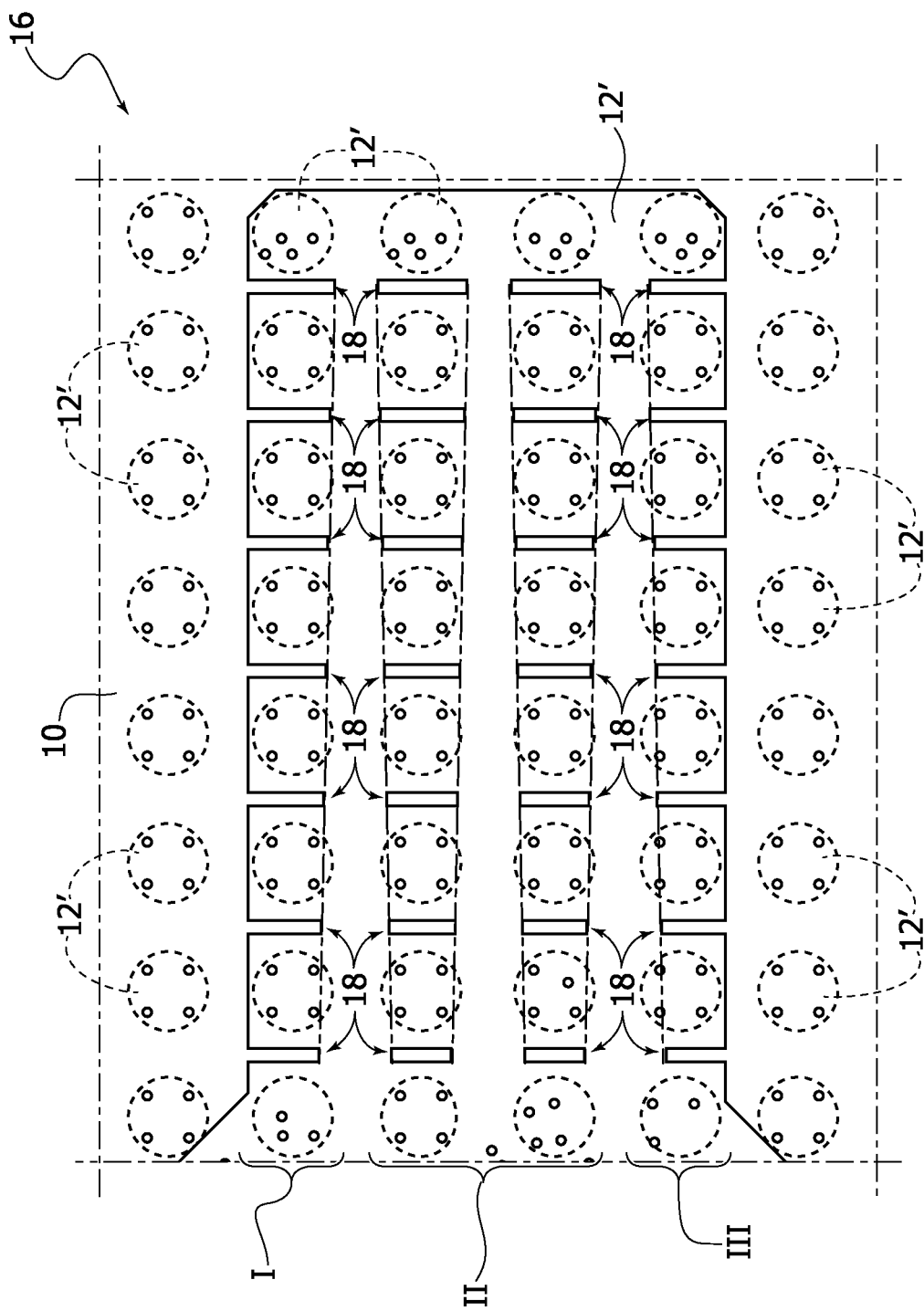
FIG. 10 is a plan view illustrative of a power channel according to the present description which may be included in a BGA package as exemplified in FIG. 1.

FIG. 10 is exemplary of the possibility of extending the concepts discussed above to multi-row power channels 16 including more than two rows or columns of balls 12.

For simplicity, in figures such as FIG. 10 only ball locations (and not balls proper) are illustrated in dashed lines and indicated by reference 12'.

The power channel 16 illustrated in FIG. 10 comprises four rows or columns of balls 12 with voids 18 defining three (essentially parallel) conductive branches which (all) exhibit a flared shape going (right-to-left) from the periphery to the central portion of the package 10 and a tapered shape going (left to right) from the central portion to the periphery of the package 10.

A power channel structure as exemplified in FIG. 10 can be replicated (in a manner known per se to those of skill in the art) with an offset of the voids on multiple power layers.

That structure is also replicable on the XY plane, thanks to the position of the voids in the inner channel rows. In the presence of voids centered with respect to the balls, the full layout of one channel row can be replicated on a number n rows, which facilitates achieving a regular structure and the design process.

As exemplified in FIG. 10, the three conductive branches in the power channel 10 may be defined by four rows of voids 18 having different lengths in order to provide a desired variation of the width of branches, that is with the power channel connection plane 12A in FIG. 10 which is "more resistive" at the right side of the figure (periphery of the package 10) and "less resistive" at the left side of the figure (towards the center of the package 10).

As exemplified in FIG. 10, these four rows of voids 18 may be arranged in three sets, comprising: a first set, indicated at reference I, comprising a row of "open" voids 10 between the upper side of the power channel connection plane 12A and the first (uppermost) electrically-conductive branch of the power channel 16; a second set, indicated at reference II, comprising two rows of "full" voids 10, the former between the first (uppermost) electrically-conductive branch of the power channel 16 and the second (central) electrically-conductive branch of the power channel 16, and the latter between the second (central) electrically-conductive branch of the power channel 16 the third (lowermost) electrically-conductive branch of the power channel 16; and a third set, indicated at reference III, comprising again a row of "open" voids 10 between the third (lowermost) electrically-conductive branch of the power channel 16 and the lower side of the power channel connection plane 12A.

Figure 11:
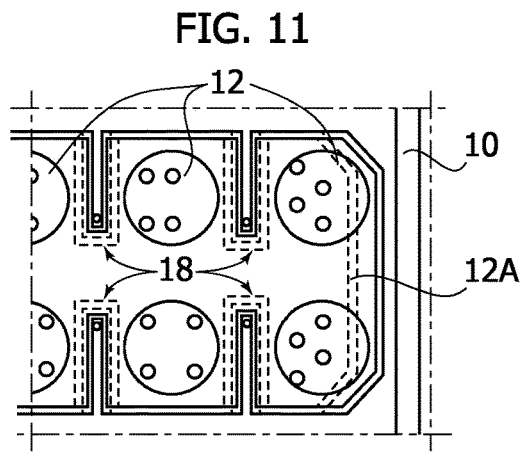
FIGS. 11 to 13 are plan views illustrative of a power channel according to the present description.
Figure 12:
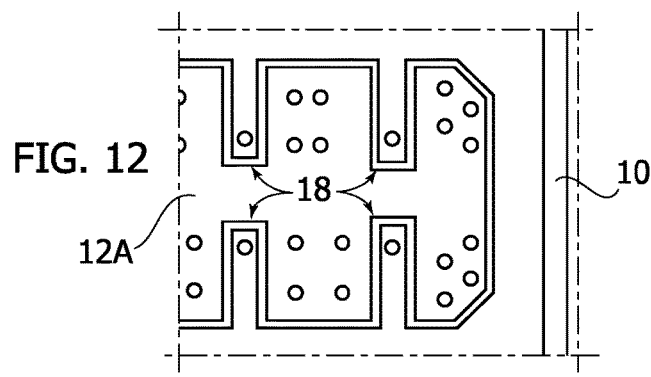
Figure 13:
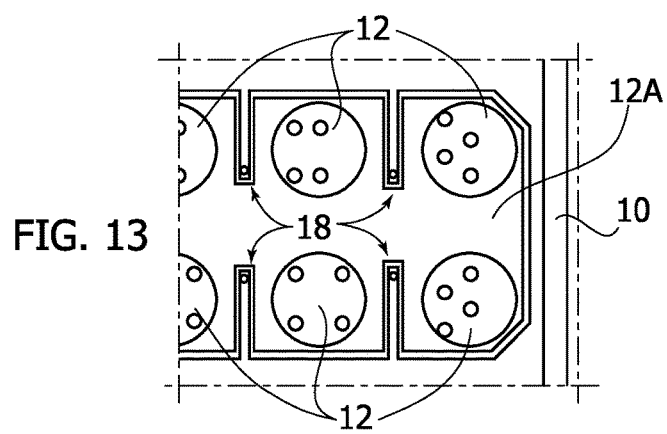

FIGS. 11 to 13 are exemplary of how larger voids 18 facilitate achieving higher planar (electrical) resistance, with overlapping ground GND shapes on adjacent layers to avoid direct void overlap.

In that respect, FIG. 11 again provides an exemplary plan view of a "complete" power channel 16 (bottom metal layer plus top layer) with the upper (inner) layer and the bottom metal layer illustrated separately in FIGS. 12 and 13. The figures refer to GND-filled voids 18 in the "open void" option.

Here again it is noted that one or more embodiments can be applied also to multiple planar layers, possibly including more than two layers.

The case of two connection plane layers, presented in FIGS. 7, 8 and 9, is thus merely exemplary of such a multiple-layer structure with the purposes of exemplifying how voids can be shifted avoiding overlap when layers are adjacent.

Figure 14:
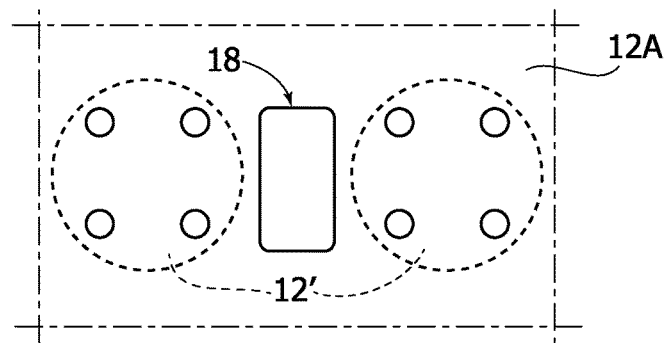
FIGS. 14 to 17 are detailed views of a portion a power channel according to the present description.
Figure 15:
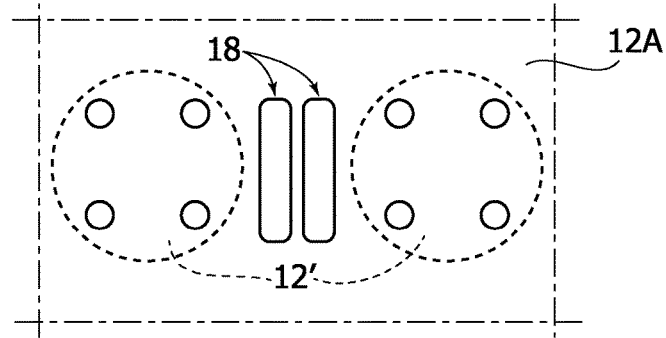

FIGS. 14 and 15 (where ball locations are again illustrated in dashed lines and indicated as 12') are exemplary of larger voids 18 being helpful in increasing (electrical) resistance of the power channel connection plane 12A based on current specifications.

It is otherwise noted that larger voids 18 may militate against proper copper balancing between layers. Replacing a single larger void 18 (FIG. 14) with two or more neighboring voids 18 (FIG. 15) may facilitate addressing that issue.

Figure 16:
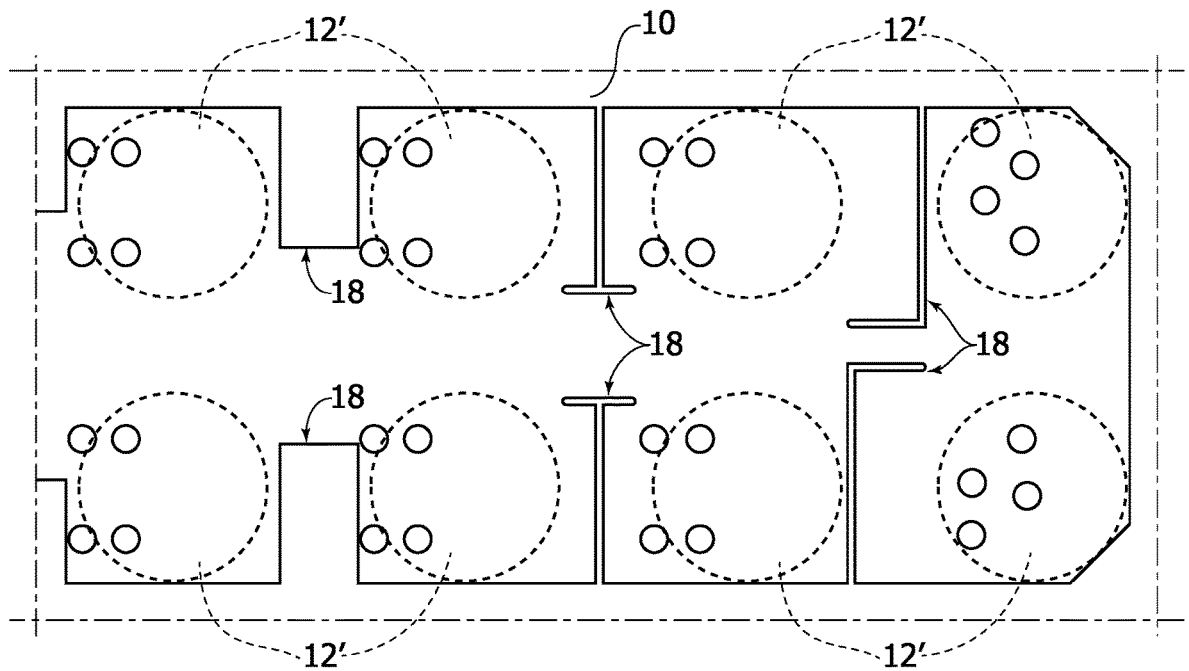
Figure 17:
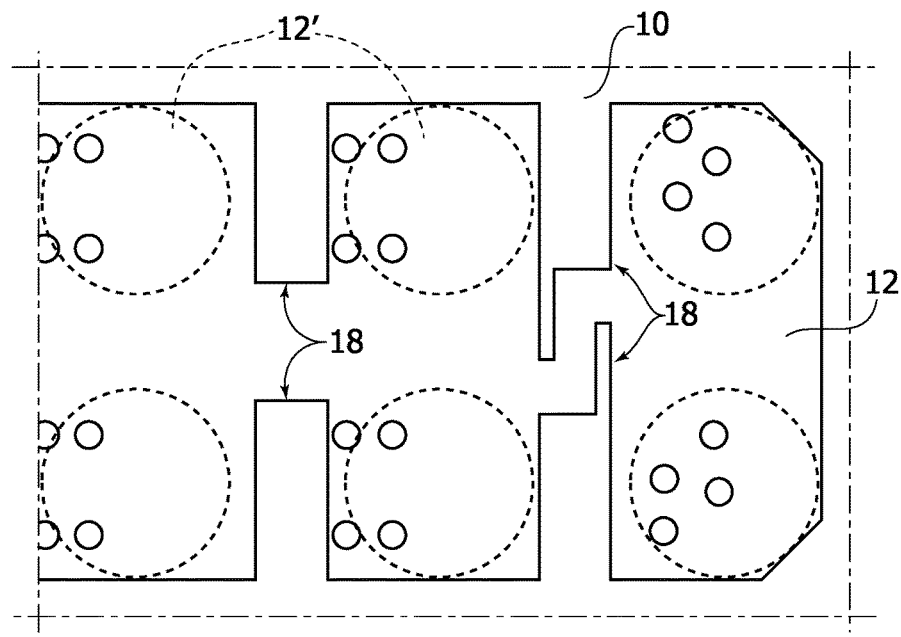

FIGS. 16 and 17 (where ball locations are once more illustrated in dashed lines and indicated as 12') are exemplary of the possibility of avoiding large voids 18 by adopting (possibly by at least partly filling voids with GND material) tortuous shapes such as "T" shapes (FIG. 16, center) or "L" shapes (FIG. 16, center) capable of providing high resistance values even without taking a large portion of the surface of the power channel connection plane 12A.

FIG. 17 (right-hand side) exemplifies the possibility of increasing (for instance with voids 18 defining therebetween an S-shaped potion of the power channel connection plane 12A) the total length L of a narrow portion of the power channel connection plane 12A between adjacent pairs of balls 12 without affecting the width W. This may facilitate creating a higher resistance without giving rise to a critical bottleneck on the power channel connection plane 12A.

Figure 5:
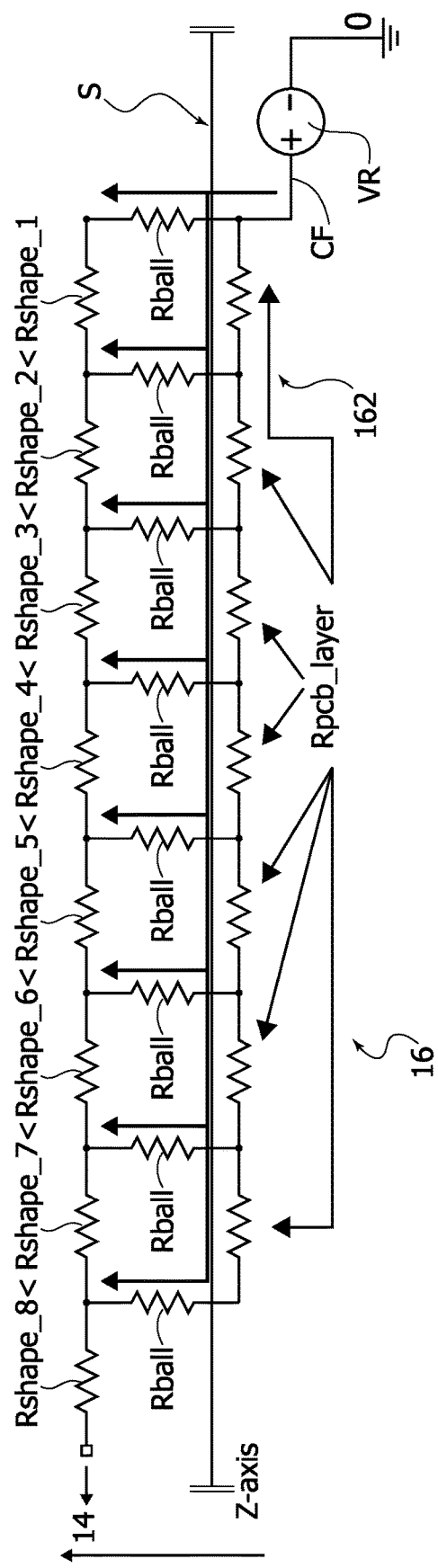
FIG. 5 is a circuit diagram explanatory of operation of a power channel as exemplified in FIG. 4.

Comparison of an arrangement as exemplified in FIGS. 2 and 3 (power channel connection plane 12A of uniform width/resistance) with an arrangement as exemplified in FIGS. 4 and 5 (power channel connection plane 12A of varying width with decreasing resistance $Rshape\_8 < Rshape\_7 < Rshape\_6 < Rshape\_5 < Rshape\_4 < Rshape\_3 < Rshape\_2 < Rshape\_1$) indicates the following:

In an arrangement as exemplified in FIGS. 2 and 3, with a current through the "first" pair of balls 162, nearest to the package periphery having an intensity of about 8.7% of the total current (6A, for instance) the current through other pairs of balls nearer to the package center (power balls 122 and area of the die 14) may be as low as 0.3% of the total current; this is indicative of a markedly uneven distribution of the current CF, which flows primarily through the balls nearest to the package periphery; and In an arrangement as exemplified in FIGS. 4 and 5, the current intensities through the pairs of balls in the power channel 16 were found to vary (mainly due to manufacturing tolerances) over the various ball pairs between 1.8% and 3.3% of the total current (here again, 6A); this is indicative of a largely homogenous distribution of the current CF, which flows in a (much) more uniform manner through all the balls 12 in the power channel 16.

A semiconductor device as exemplified herein may comprise: a semiconductor die (for instance, 14) mounted at a die area of a package (for instance, 10) with an array of electrically-conductive balls (for instance, 12) providing electrical contact for the semiconductor die; a power channel (for instance, 16) to convey a power supply current (for instance, CF) to the semiconductor die (14), wherein the power channel comprises at least one electrically-conductive connection plane layer (for instance, 12A) extending in a longitudinal direction of the (at least one) electrically-conductive connection plane layer between a distal end at the periphery of the package and a proximal end at the die area of the package (for instance, at the power balls 122) and a distribution of electrically-conductive balls (12) distributed along the longitudinal direction of the (at least one) electrically conductive connection plane layer (12A), the (at least one) electrically-conductive connection plane layer (12A) comprising subsequent portions in said longitudinal direction between adjacent electrically-conductive balls in said distribution, said subsequent portions having respective electrical resistance values, wherein said respective electrical resistance values are monotonously decreasing (for instance, $Rshape\_8 < Rshape\_7 < Rshape\_6 < Rshape\_5 < Rshape\_4 < Rshape\_3 < Rshape\_2 < Rshape\_1$) from said distal end to said proximal end of the electrically-conductive connection plane layer.

In a semiconductor device as exemplified herein, said subsequent portions the (at least one) electrically-conductive connection plane layer have respective widths (see, for instance, W in FIG. 6) increasing from said distal end towards said proximal end of the (at least one) electrically-conductive connection plane layer and/or respective lengths (see, for instance, L in FIG. 6) decreasing from said distal end towards said proximal end of the electrically-conductive connection plane layer).

In a semiconductor device as exemplified herein, the distribution of electrically-conductive balls in the power channel may comprise a plurality of rows of electrically-conductive balls distributed along the longitudinal direction of the (at least one) electrically conductive connection plane layer, with adjacent rows of electrically-conductive balls (see, for instance the two rows or columns of balls 12 in figures such as FIG. 4 or FIG. 6 or the four rows or columns of balls 12 in FIG. 10) defining therebetween subsequent portions of the (at least one) electrically-conductive connection plane layer extending in said longitudinal direction having respective electrical resistance values, wherein said respective electrical resistance values are (monotonously) decreasing from said distal end towards said proximal end of the electrically-conductive connection plane layer (12A).

In a semiconductor device as exemplified herein, the (at least one) electrically-conductive connection plane layer may comprise voids (for instance, 18) formed therein between adjacent electrically-conductive balls in said distribution, wherein said voids define therebetween said subsequent portions of the (at least one) electrically-conductive connection plane layer having respective electrical resistance values.

In a semiconductor device as exemplified herein, such voids may comprise: full voids fully included in the (at least one) electrically-conductive connection plane layer (that is, "internal" voids completely surrounded by the power channel connection plane 12A: see, for instance, the upper voids 18 in FIGS. 7 to 9, the mid-height voids 18 in FIG. 10 and the voids in FIGS. 14 and 15), and/or open voids extending to a side of the (at least one) electrically-conductive connection plane layer (that is, "side" voids formed at the sides of the power channel connection plane 12A: see, for instance, the lower voids 18 in FIGS. 7 to 9, the uppermost and lowermost voids 18 in FIG. 10, as well as the voids 18 in FIGS. 11 to 13 and in FIGS. 16 and 17).

In a semiconductor device as exemplified herein, the (at least one) electrically-conductive connection plane layer may comprise opposed sides extending in said longitudinal direction, the opposed sides having formed therein complementary distributions of said open voids (see, for instance, the uppermost and lowermost voids 18 in FIG. 10, as well as the voids 18 in FIGS. 11 to 13 and in FIGS. 16 and 17).

In a semiconductor device as exemplified herein, the (at least one) electrically-conductive connection plane layer may comprise at least one distribution of said full voids extending in said longitudinal direction between said opposed sides having formed therein complementary distributions of said open voids (see, for instance, the two rows of mid-height voids 18 in FIG. 10 extending between the uppermost and lowermost voids 18.

In a semiconductor device as exemplified herein, the (at least one) electrically-conductive connection plane layer may comprise: T-shaped or L-shaped voids formed therein (see, for instance, FIG. 16, right side); and/or meander-shaped portions extending in said longitudinal direction (see, for instance, the S-shaped or serpentine-shaped portion of the power channel connection plane 12A in FIG. 17, right side).

A method as exemplified herein may comprise: providing electrical contact for a semiconductor die mounted at a die area of a semiconductor device package (wherein electrical contact is provided) via an array of electrically-conductive balls; and conveying a power supply current (for instance, CF) to the semiconductor die via a power channel extending in a longitudinal direction between a distal end at the periphery of the package and a proximal end at the die area of the package, wherein the power channel comprises a distribution of electrically-conductive balls distributed along said longitudinal direction, the power channel comprising subsequent portions extending in said longitudinal direction between adjacent electrically-conductive balls in said distribution, said subsequent portions having respective electrical resistance values, wherein said respective electrical resistance values are decreasing (for instance, Rshape_8<Rshape_7<Rshape_6<Rshape_5<Rshape_4< Rshape_3<Rshape_2<Rshape_1) from said distal end to said proximal end of the electrically-conductive connection plane layer.

Without prejudice to the underlying principles, the details and embodiments may vary, even significantly, with respect to what has been described by way of example only without departing from the extent of protection.

The claims are an integral part of the technical teaching provided herein in respect of the embodiments.

The extent of protection is determined by the annexed claims.

The invention claimed is:

1. A semiconductor device, comprising:
   a semiconductor die mounted at a die area of a package with an array of electrically-conductive balls providing electrical contact for the semiconductor die; and
   a power channel to convey a power supply current to the semiconductor die;
   wherein the power channel comprises:
   at least one electrically-conductive connection plane layer extending in a longitudinal direction of the electrically-conductive connection plane layer between a distal end at the periphery of the package and a proximal end at the die area of the package; and
   wherein said array of electrically-conductive balls includes a distribution of electrically-conductive balls distributed along the longitudinal direction of the electrically conductive connection plane layer;
   said electrically-conductive connection plane layer comprising subsequent portions in said longitudinal direction between adjacent electrically-conductive balls in said distribution;
   wherein said subsequent portions have respective electrical resistance values, wherein said respective electrical resistance values decrease from said distal end to said proximal end of the electrically-conductive connection plane layer;
   wherein the electrically-conductive connection plane layer comprises voids formed therein between adjacent electrically-conductive balls in said distribution, wherein said voids define therebetween said subsequent portions of the electrically-conductive connection plane layer having respective electrical resistance values; and
   wherein said voids filled with ground material.

2. The semiconductor device of claim 1, wherein said subsequent portions the electrically-conductive connection plane layer have respective widths increasing from said distal end to said proximal end of the electrically-conductive connection plane layer.

3. The semiconductor device of claim 1, wherein said subsequent portions the electrically-conductive connection plane layer have respective lengths decreasing from said distal end to said proximal end of the electrically-conductive connection plane layer.

4. The semiconductor device of claim 1, wherein the distribution of electrically-conductive balls in the power channel comprises a plurality of rows of electrically-conductive balls distributed along the longitudinal direction of the electrically conductive connection plane layer, with adjacent rows of electrically-conductive balls defining therebetween subsequent portions of the electrically-conductive connection plane layer extending in said longitudinal direction having respective electrical resistance values, wherein said respective electrical resistance values decrease from said distal end to said proximal end of the electrically-conductive connection plane layer.

5. The semiconductor device of claim 1, wherein the voids comprise full voids fully included in the electrically-conductive connection plane layer.

6. The semiconductor device of claim 1, wherein the voids comprise open voids extending to a side of the electrically-conductive connection plane layer.

7. The semiconductor device of claim 1, wherein the electrically-conductive connection plane layer comprises opposed sides extending in said longitudinal direction, the opposed sides having formed therein complementary distributions of said open voids.

8. The semiconductor device of claim 7, wherein the electrically-conductive connection plane layer comprises at least one distribution of full voids fully included in the electrically-conductive connection plane layer extending in said longitudinal direction between the opposed sides having formed therein complementary distributions of open voids extending to a side of the electrically-conductive connection plane layer.

9. The semiconductor device of claim 1, wherein the electrically-conductive connection plane layer comprises T-shaped voids formed therein.

10. The semiconductor device of claim 1, wherein the electrically-conductive connection plane layer comprises L-shaped voids formed therein.

11. The semiconductor device of claim 1, wherein the electrically-conductive connection plane layer comprises meander-shaped portions extending in said longitudinal direction.

12. The semiconductor device of claim 1, wherein said void filled with ground material comprises at least one electrical connection via located within the void.

13. A semiconductor device, comprising:
a semiconductor die mounted at a front side of a package;
an array of electrically-conductive balls mounted to a back side of the package; and
a power channel to convey a power supply current to the semiconductor die;
wherein the power channel comprises:
an electrically-conductive connection plane layer having a length in a longitudinal direction and a width extending perpendicular to the length, the length the electrically-conductive connection plane layer extending from a distal end at a periphery of the package to a proximal end at a die area of the package; and
wherein said array of electrically-conductive balls comprises a distribution of electrically-conductive balls along the longitudinal direction of the electrically conductive connection plane layer, said distribution including a plurality of adjacent pairs of electrically-conductive balls;
wherein said electrically-conductive connection plane layer includes a void formed therein between each adjacent pair of electrically-conductive balls of said distribution in said longitudinal direction, where a portion of the electrically-conductive connection plane layer between adjacent voids along the longitudinal direction has an electrical resistance value;
wherein respective electrical resistance values for said portions of the electrically-conductive connection plane layer decrease from said distal end to said proximal end; and
wherein said void is filled with ground material.

14. The semiconductor device of claim 13, wherein said void comprises a full void that is fully included in the electrically-conductive connection plane layer.

15. The semiconductor device of claim 13, wherein said void comprises an open void extending to a side of the electrically-conductive connection plane layer.

16. The semiconductor device of claim 13, wherein the electrically-conductive connection plane layer comprises opposed sides extending in said longitudinal direction, said void comprising open voids at the opposed sides.

17. The semiconductor device of claim 13, wherein the electrically-conductive connection plane layer comprises opposed sides extending in said longitudinal direction, said void comprising a full void adjacent an open void located at one of said opposed sides.

18. The semiconductor device of claim 13, wherein said void comprises a T-shaped void.

19. The semiconductor device of claim 13, wherein said void comprises an L-shaped void.

20. The semiconductor device of claim 13, wherein said void comprises a meander-shaped portion.

21. The semiconductor device of claim 13, wherein said void filled with ground material comprises at least one electrical connection via located within the void.

* * * * *